(12) United States Patent
Yoshinaga et al.

(10) Patent No.: US 11,450,795 B2
(45) Date of Patent: Sep. 20, 2022

(54) LIGHT-EMITTING MODULE AND SURFACE-EMITTING LIGHT SOURCE INCLUDING A PLURALITY OF WIRING FORMATIONS BETWEEN TWO TERMINALS

(71) Applicant: NICHIA CORPORATION, Anan (JP)

(72) Inventors: Satoshi Yoshinaga, Yoshinogawa (JP); Yasunori Shinomiya, Tokushima (JP)

(73) Assignee: Nichia Corporation, Anan (JP)

( * ) Notice: Subject to any disclaimer, the term of this patent is extended or adjusted under 35 U.S.C. 154(b) by 0 days.

(21) Appl. No.: 16/887,912

(22) Filed: May 29, 2020

(65) Prior Publication Data

US 2020/0381602 A1 Dec. 3, 2020

(30) Foreign Application Priority Data

May 31, 2019 (JP) .............................. JP2019-103227
Feb. 5, 2020 (JP) .............................. JP2020-017838

(51) Int. Cl.
*H01L 33/62* (2010.01)
*H01L 33/38* (2010.01)
*H01L 25/075* (2006.01)

(52) U.S. Cl.
CPC .......... *H01L 33/62* (2013.01); *H01L 25/0753* (2013.01); *H01L 33/387* (2013.01)

(58) Field of Classification Search
CPC ......................... H01L 33/62; H01L 33/36–387
See application file for complete search history.

(56) References Cited

U.S. PATENT DOCUMENTS 9,681,511 B1 * 6/2017 Barbosa ................. H05B 45/40
10,768,353 B2 * 9/2020 Hayashi ............... G02B 6/0016
2007/0121340 A1 5/2007 Hoshi
2009/0091920 A1 4/2009 Naijo et al.
(Continued)

FOREIGN PATENT DOCUMENTS

JP 2007-149451 A 6/2007
JP 2007-200877 A 8/2007
(Continued)

*Primary Examiner* — Ismail A Muse
*Assistant Examiner* — Gustavo G Ramallo
(74) *Attorney, Agent, or Firm* — Birch, Stewart, Kolasch & Birch, LLP

(57) ABSTRACT

A light-emitting module according to an embodiment includes a plurality of light-emitting elements, light-guiding plates each having a light-exiting surface, and a wiring layer connected to electrodes of the plurality of light-emitting elements on a surface opposite to the light-exiting surface. The wiring layer includes a first terminal, a second terminal, a first wiring pattern connecting the first terminal and the second terminal, a second wiring pattern connecting the first terminal and the second terminal, a third wiring pattern disposed between the first wiring pattern and the second wiring pattern to connect the first terminal and the second terminal, a fourth wiring pattern connecting the first to third wiring patterns in parallel, the fourth wiring pattern being connected to the first terminal, and a fifth wiring pattern connecting the first to third wiring patterns in parallel, the fifth wiring pattern being connected to the second terminal.

8 Claims, 11 Drawing Sheets

(56) References Cited

U.S. PATENT DOCUMENTS

| | | | |
|---|---|---|---|
| 2009/0272991 A1* | 11/2009 | Lee | H01L 25/0753 257/E33.056 |
| 2011/0062459 A1* | 3/2011 | Kal | H01L 27/156 257/E33.064 |
| 2011/0149594 A1 | 6/2011 | Terajima et al. | |
| 2012/0224111 A1 | 9/2012 | Ohshima | |
| 2013/0208026 A1* | 8/2013 | Suzuki | H01L 25/0753 257/99 |
| 2015/0022122 A1* | 1/2015 | Kim | H01B 7/0838 315/312 |
| 2018/0239193 A1 | 8/2018 | Hayashi | |
| 2019/0227382 A1 | 7/2019 | Watanabe et al. | |
| 2020/0049876 A1 | 2/2020 | Watanabe et al. | |
| 2020/0049877 A1 | 2/2020 | Watanabe et al. | |

FOREIGN PATENT DOCUMENTS

| | | |
|---|---|---|
| JP | 2011-113731 A | 6/2011 |
| JP | 2011-129646 A | 6/2011 |
| JP | 2011-210674 A | 10/2011 |
| JP | 2011-249593 A | 12/2011 |
| JP | 2012-182023 A | 9/2012 |
| JP | 2014-010184 A | 1/2014 |
| JP | 2018-097974 A | 6/2018 |
| JP | 2018-101521 A | 6/2018 |
| JP | 2018-106826 A | 7/2018 |
| JP | 2018-133304 A | 8/2018 |

* cited by examiner

LIGHT-EMITTING MODULE AND SURFACE-EMITTING LIGHT SOURCE INCLUDING A PLURALITY OF WIRING FORMATIONS BETWEEN TWO TERMINALS

CROSS-REFERENCE TO RELATED APPLICATION

This application claims priority to Japanese Patent Application No. 2019-103227 filed on May 31, 2019, and Japanese Patent Application No. 2020-017838 filed on Feb. 5, 2020, the disclosures of which are hereby incorporated by reference in their entireties.

BACKGROUND

Embodiments of the present disclosure relate to a light-emitting module and a surface-emitting light source.

There is a backlight module or a lighting module employing a surface-emitting light source in which a plurality of light-emitting elements such as small LEDs are two dimensionally arranged on a plane (See, for example, Japanese Patent Application No. 2011-129646).

In such a surface-emitting light source, variances in luminance between light-emitting elements cause luminance unevenness, which may affect the quality of images or illumination.

SUMMARY

According to certain embodiments, a light-emitting module and a surface-emitting light source with reduced variations in luminance can be provided.

A light-emitting module according to an embodiment of the present disclosure includes a plurality of light-emitting elements arranged in a plan, a light-guiding plate, and a wiring layer. The light-guiding plate has a light-exiting surface and provided for the plurality of light-emitting elements. The wiring layer is disposed on a wiring formation surface opposite to the light-exiting surface of the light-guide plate. The wiring formation surface is constituted of electrodes of the plurality of light-emitting elements exposed at the wiring formation surface, and connected to the electrodes of the plurality of light-emitting elements. The wiring layer comprises a first terminal, a second terminal capable of receiving a lower voltage than a voltage applied to the first terminal, and a plurality of wiring patterns. The wiring patterns include: a first wiring pattern connecting the first terminal and the second terminal; a second wiring pattern connecting the first terminal and the second terminal; a third wiring pattern disposed between the first wiring pattern and the second wiring pattern to connect the first terminal and the second terminal; a fourth wiring pattern connecting the first wiring pattern, the second wiring pattern, and the third wiring pattern in parallel, the fourth wiring pattern being connected to the first terminal; and a fifth wiring pattern connecting the first wiring pattern, the second wiring pattern, and the third wiring pattern in parallel, the fifth wiring pattern being connected to the second terminal. A wiring length from the first terminal through the first wiring pattern to the second terminal, a wiring length from the first terminal through the second wiring pattern to the second terminal, and a wiring length from the first terminal through the third wiring pattern to the second terminal are the same. A resistance of the third wiring pattern is lower than a resistance of the first wiring pattern and lower than a resistance of the second wiring pattern.

According to the certain embodiments of the present disclosure, a light-emitting module and a surface-emitting light source with reduced variances in luminance can be provided.

DESCRIPTION

Figure 1:
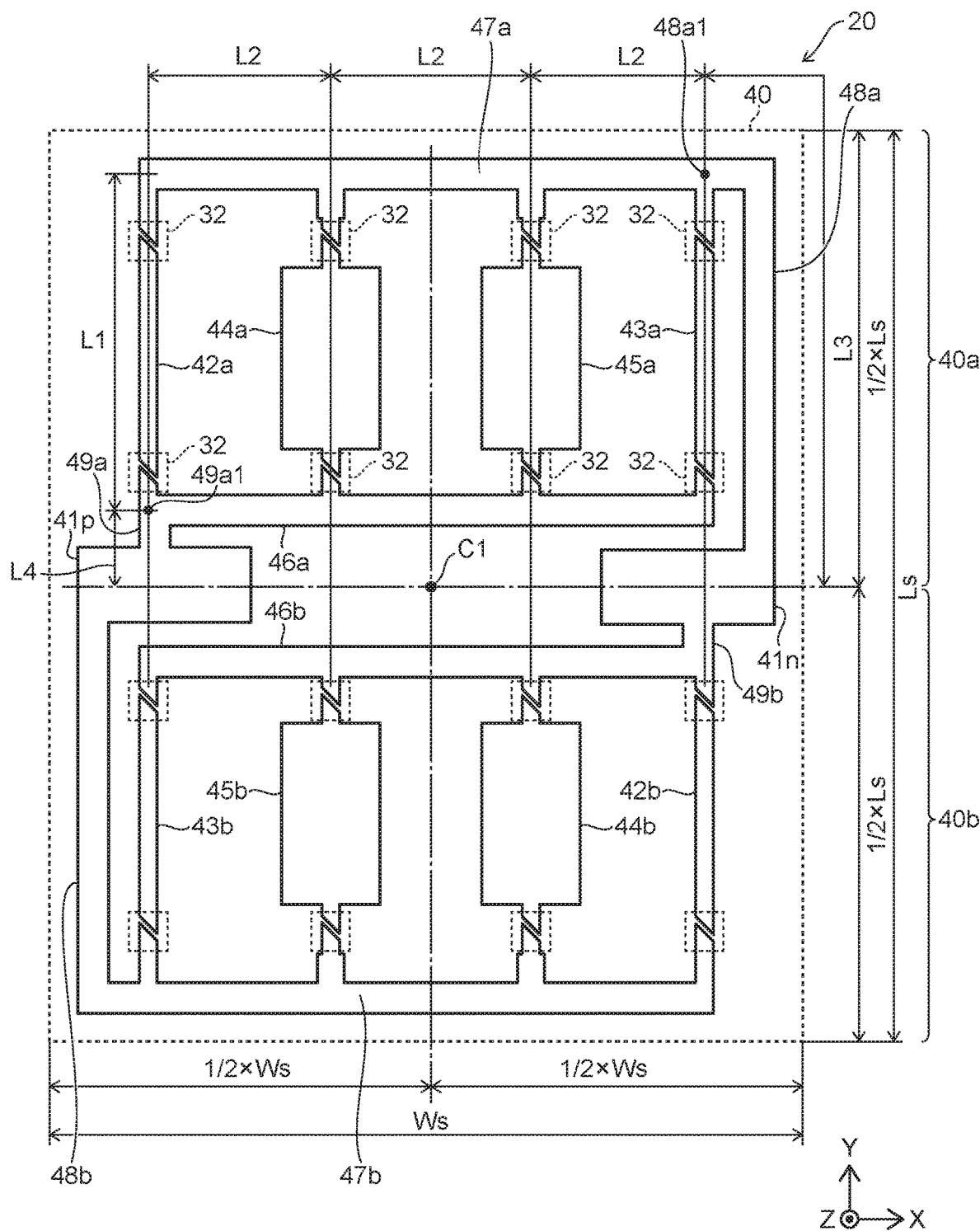
FIG. 1 is a schematic top view showing an example of a portion of a light-emitting module according to a first embodiment.

The following describes embodiments of the present invention referring to the accompanying drawings.

The drawings are schematic or conceptual, and the relationship between the thickness and the width of each unit, the ratio between the sizes of units, and other relationships are not necessarily the same as the actual relationships. Also, the dimensions and ratios of the same unit may be different between drawings.

In the specification and the drawings of the present application, substantially the same element as an element described referring to a drawing previously described is indicated by the same reference numeral, and its detailed description is omitted as appropriate.

First Embodiment

FIG. 1 is a schematic plan view showing an example of a portion of a light-emitting module according to the present embodiment.

FIG. 1 schematically shows the layout of wiring patterns of a wiring layer 40 in a light-emitting module 20 of the present embodiment. As described below, the wiring layer 40 is disposed on a wiring formation surface 34e (FIG. 6B and FIG. 7) of the light-emitting module 20.

Three-dimensional coordinates can be used in the following description. The wiring layer 40 and the wiring formation surface are parallel to the XY plane. The three-dimensional coordinates are in a right-handed coordinate system, and the Z-axis extends in a facing direction from the plane of the drawing. Light-emitting elements 32 are mounted on the wiring patterns of the wiring layer 40, and the light-exiting surfaces of the light-emitting elements 32 face the negative direction of the Z-axis.

The light-emitting module 20 includes a plurality of light-emitting elements 32 and the wiring layer 40 as shown in FIG. 1. The light-emitting elements 32 are disposed on the wiring layer 40 and are therefore arranged substantially in the XY plane. As described below, the light-exiting surfaces of the light-emitting elements 32 face the negative direction of the Z-axis, and the light-exiting surfaces of the light-emitting elements 32 facing the same direction constitute the surface-emitting light source.

The wiring layer 40 includes a plurality of wiring patterns that are substantially parallel to the XY plane, and are each used for electrical connection of the corresponding light-emitting elements 32.

The wiring layer 40 includes terminals 41p and 41n and wiring-pattern groups 40a and 40b. The wiring-pattern groups 40a and 40b are connected in parallel between the terminals 41p and 41n. A DC or pulse voltage lower than the voltage applied to the terminal (first terminal) 41p can be applied to the terminal (second terminal) 41n.

The wiring-pattern groups 40a and 40b are geometrically equivalent circuits. In other words, the wiring-pattern groups 40a and 40b are constituted of the same components and are symmetric about a point C1. The point C1 is the center of the wiring layer 40. More specifically, the wiring layer 40 has a rectangular shape having a length (width) Ws in the X-axis direction and a length Ls in the Y-axis direction in a top view of the XY plane, and the point C1, which is the center of the wiring layer 40, is located at the point of (½)×Ws and (½)×Ls, in other words, located in the middle of Ws and middle of Ls. As the wiring-pattern groups 40a and 40b are equivalent as described above, the constitution of the wiring-pattern group 40a will be mainly described below.

The terminal 41p is located at a position including the point at which the straight line parallel to the X-axis passing through the point C1 intersects with the center in the width direction of a Y wiring pattern 42a. The terminal 41n is located at a position including the point at which the straight line parallel to the X-axis passing through the point C1 intersects with the center in the width direction of a Y wiring pattern 43a.

The wiring-pattern group 40a includes wiring patterns (hereinafter referred to as Y wiring patterns) 42a to 45a (i.e., 42a, 43a, 44a and 45a) extending in the Y-axis direction, and wiring patterns (hereinafter referred to as X wiring patterns) 46a and 47a extending in the X-axis direction. The wiring-pattern group 40b includes Y wiring patterns 42b to 45b and X wiring patterns 46b and 47b.

The Y wiring patterns 44a and 45a (hereinafter referred to as third wiring patterns) are disposed between the Y wiring patterns 42a (hereinafter referred to as first wiring pattern) and 43a (hereinafter referred to as second wiring pattern). The Y wiring patterns 42a to 45a have substantially the same wiring lengths and are disposed at substantially regular intervals. The wiring lengths of the Y wiring patterns 42a to 45a each refer to the length from the point, at which the center line in the width direction of corresponding one of the Y wiring patterns 42a to 45a intersects with the center line in the width direction of the X wiring pattern 46a, to the point, at which the center line in the width direction of corresponding one of the Y wiring patterns 42a to 45a intersects with the center line in the width direction of the X wiring pattern 47a. In this example, the wiring lengths of the Y wiring patterns 42a to 45a are respectively a wiring length L1 in the Y-axis direction. The Y wiring patterns 42a, 44a, 45a, and 43a are aligned substantially parallel to each other in this order in the positive direction of the X-axis at substantially regular intervals L2. The wiring length L1 refers to the distance between the centers of the widths of the X wiring patterns 46a and 47a. The intervals L2 are respectively the distances between adjacent Y wiring patterns, that is, the distances between the centers of the widths of the Y wiring patterns 42a to 45a.

The X wiring pattern 46a (hereinafter referred to as fourth wiring pattern) is connected to one end of each of the Y wiring patterns 42a to 45a. The X wiring pattern 47a (hereinafter referred to as fifth wiring pattern) is connected to the other end of each of the Y wiring patterns 42a to 45a. That is, the Y wiring patterns 42a to 45a connect the X wiring patterns 46a and 47a. In other words, the X wiring patterns 46a and 47a connect the Y wiring patterns 42a to 45a in parallel. The X wiring patterns 46a and 47a are disposed substantially parallel to each other at the interval L1.

The X wiring pattern 46a is connected to a wiring pattern 49a at a joint 49a1 between the X wiring pattern 46a and the Y wiring pattern 42a, and is connected to the terminal 41p via the wiring pattern 49a. The wiring pattern 49a is elongated in the Y-axis direction. The position of the joint 49a1 is the point of intersection of the center line in the width direction of the Y wiring pattern 42a and the center line in the width direction of the X wiring pattern 46a.

The X wiring pattern 47a is connected to a wiring pattern 48a at a joint 48a1 between the X wiring pattern 47a and the Y wiring pattern 43a, and is connected to the terminal 41n via the wiring pattern 48a. The wiring pattern 48a is elongated in the Y-axis direction. The position of the joint 48a1 is the point of intersection of the center line in the width direction of the Y wiring pattern 43a and the center line in the width direction of the X wiring pattern 47a.

The length of the wiring pattern 48a from the joint 48a1 to the terminal 41n is a length L3. The length of the wiring pattern 49a from the joint 49a1 to the terminal 41p is a length L4. The same applies to the wiring-pattern group 40b.

That is, a wiring pattern 48b has the length L3, and a wiring pattern 49b has the length L4. The wiring-pattern groups 40a and 40b are connected in parallel by the terminals 41p and 41n, and therefore the path length from the terminal 41p to the terminal 41n through the wiring-pattern group 40a is substantially equal to the path length from the terminal 41p to the terminal 41n through the wiring-pattern group 40b. The following describes the above feature more specifically.

In the wiring-pattern group 40a, the wiring length from the terminal 41p through the Y wiring pattern 42a to the terminal 41n is L4+L1+3×L2+L3=L4+L1+3×L2+L3.

As for the Y wiring pattern 44a, the wiring length from the terminal 41p through the Y wiring pattern 44a to the terminal 41n is L4+L2+L1+2×L2+L3=L4+L1+3×L2+L3.

As for the Y wiring pattern 45a, the wiring length from the terminal 41p through the Y wiring pattern 45a to the terminal 41n is L4+2×L2+L1+L2+L3=L4+L1+3×L2+L3.

As for the Y wiring pattern 43a, the wiring length from the terminal 41p through the Y wiring pattern 43a to the terminal 41n is L4+3×L2+L1+L3=L4+L1+3×L2+L3.

As described above, as for the Y wiring patterns 42a to 45a separated from each other and connected in parallel by the X wiring patterns 46a and 47a, the wiring length from the terminal 41p to the terminal 41n does not substantially vary whichever one of the Y wiring patterns 42a to 45a is selected. That is, the wiring layer 40 is a wiring pattern constituted by substantially equal-length wiring.

In this example, the thicknesses of the terminals 41p and 41n and the X and Y wiring patterns 42a to 49a (i.e., 42a, 43a, 44a, 45a, 46a, 47a, 48a and 49a) and 42b to 49b (i.e., 42b, 43b, 44b, 45b, 46b, 47b, 48b and 49b) are the same.

The terminals 41p and 41n and the X and Y wiring patterns 42a to 49a and 42b to 49b of the wiring layer 40 are formed of, for example, sintered bodies of electrically conductive particles or paste containing electrically conductive particles. The electrically conductive particles are, for example, particles of Ag or Cu.

Figure 2A:
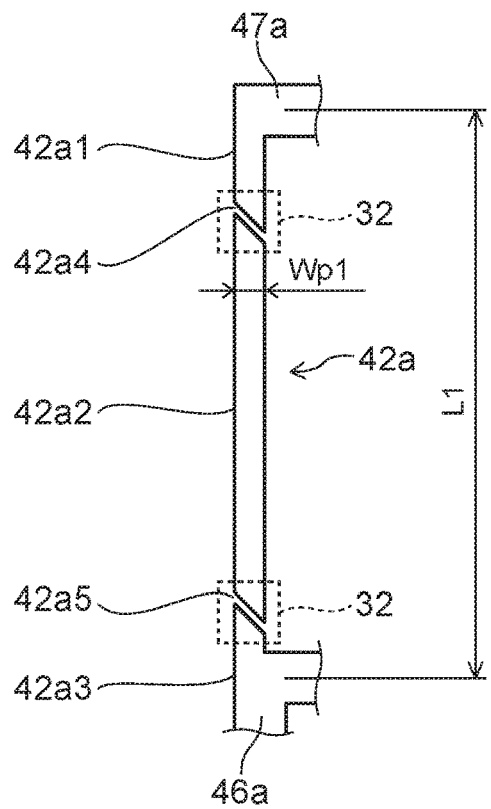
FIG. 2A is a schematic top view showing an example of a portion of the light-emitting module of the first embodiment.
Figure 2B:
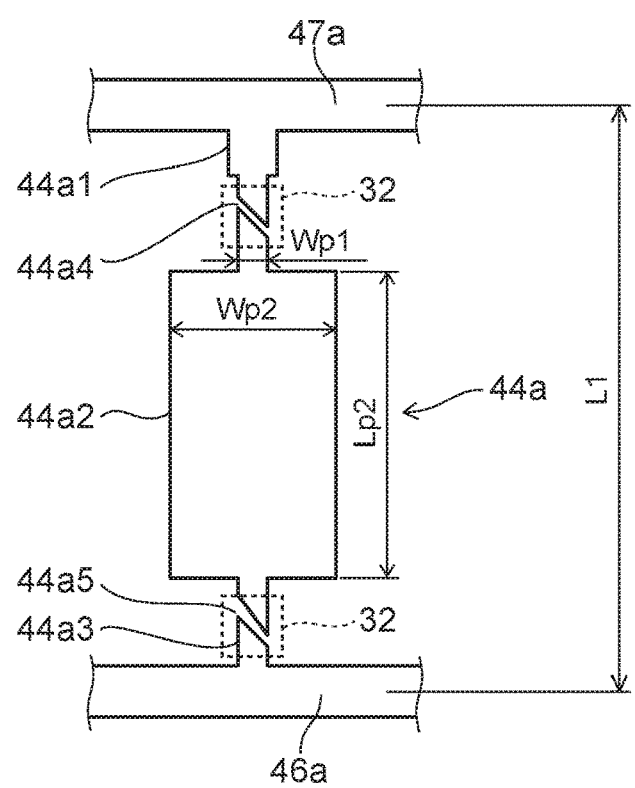
FIG. 2B is a schematic top view showing an example of a portion of the light-emitting module of the first embodiment.

FIG. 2A and FIG. 2B are schematic plan views showing an example of a portion of the light-emitting module of the first embodiment.

FIG. 2A is a schematic enlarged view of the Y wiring pattern 42a. The Y wiring patterns 43a, 42b, and 43b have substantially the same structure.

As shown in FIG. 2A, the Y wiring pattern 42a includes a plurality of wiring patterns 42a1, 42a2, and 42a3. The wiring pattern 42a1 is connected to the X wiring pattern 47a. The wiring pattern 42a3 is connected to the X wiring pattern 46a. A gap 42a4 exposed from the wiring formation surface 34e is formed between the wiring patterns 42a1 and 42a2. A gap 42a5 is formed between the wiring patterns 42a2 and 42a3. That is, the wiring 42a2 is disposed between the wiring patterns 42a1 and 42a3 with the gaps 42a4 and 42a5 on both sides therebetween.

A width Wp1 of the wirings 42a1 to 42a3 (i.e., 42a1, 42a4, 42a2, 42a5 and 42a3) is constant throughout the wiring length L1.

The light-emitting elements 32 (FIG. 1) are mounted astride the gaps 42a4 and 42a5. That is, in this example, the anode terminal of the light-emitting element 32 mounted astride the gap 42a4 is connected to the wiring pattern 42a2, and its cathode terminal is connected to the wiring pattern 42a1. The anode terminal of the light-emitting element mounted astride the gap 42a5 is connected to the wiring pattern 42a3, and its cathode terminal is connected to the wiring pattern 42a2.

The two light-emitting elements 32 disposed on the Y wiring pattern 42a are connected in series by the wirings 42a1 to 42a3.

FIG. 2B is a schematic enlarged view of the Y wiring pattern 44a. The Y wiring patterns 45a, 44b, and 45b have substantially the same structure.

As shown in FIG. 2B, the Y wiring pattern 44a includes a plurality of wiring patterns 44a1, 44a2, and 44a3. The wiring pattern 44a1 is connected to the X wiring pattern 47a. The wiring pattern 44a3 is connected to the X wiring pattern 46a. A gap 44a4 is formed between the wiring patterns 44a1 and 44a2. A gap 44a5 is formed between the wiring patterns 44a2 and 44a3. That is, the wiring 44a2 is disposed between the wiring patterns 44a1 and 44a3 with the gaps 44a4 and 44a5 on both sides therebetween.

Similarly to the case of the Y wiring pattern 42a, the light-emitting elements 32 are mounted astride the gaps 44a4 and 44a5. The two light-emitting elements 32 are connected in series by the wirings 44a1 to 44a3 (i.e., 44a1, 44a4, 44a2, 44a5 and 44a3).

In this example, the wiring 44a2 has a different shape from the shapes of other wirings 44a1 and 44a3. The central portion of the wiring 44a2 is a rectangular portion having a width Wp2 and a length Lp2. The width Wp2 is wider than the width Wp1 of other portions or wirings 44a1 and 44a3. The length Lp2 is shorter than the wiring length L1 of the Y wiring pattern 44a. In this example, the width of the wiring 44a1 near the joint between the wiring 44a1 and the X wiring pattern 47a is greater than the width Wp1 of other portions.

As described below, in the case in which the clearance between the electrodes of the light-emitting element 32 is narrow, the wiring layer can be formed such that the electrodes of the light-emitting element 32 are short-circuited, and then the wiring between the electrodes can be cut by, for example, laser light. In the case in which the wiring is thicker, the portion to be cut at which the wiring is partially removed by laser light is long, and the cutting may be incomplete. The width of the portion of the wiring on which the light-emitting element 32 is to be mounted is therefore often limited. Accordingly, it is preferable to adjust the resistance by changing the widths and thicknesses of the portions of the wiring 44a2 except for the portions on which the light-emitting elements 32 are to be mounted.

As for the Y wiring patterns 42a to 45a (i.e., 42a, 43a, 44a and 45a), the widths and lengths of the wirings 44a1 to 44a3 are appropriately determined to adjust the resistances of the Y wiring patterns 44a and 45a disposed between the Y wiring patterns 42a and 43a substantially parallel to each other.

As described above, in the present embodiment, the Y wiring patterns 42a to 45a and 42b to 45b connected in parallel are connected to the terminals 41p and 41n to constitute equal-length wiring. In this case, electric currents that flow through the Y wiring patterns 42a to 45a and 42b to 45b can be substantially equalized by adjusting the resistance of each of the Y wiring patterns 42a to 45a and 42b to 45b.

The light-emitting elements 32 are disposed at regular intervals in the X direction and regular intervals in the Y direction as described below, so that the luminances of the light-emitting elements 32 can be made substantially uniform by making the electric currents that flow through the light-emitting elements 32 substantially equal. The light-emitting elements 32 are disposed at regular intervals in the XY plane, and emit light with substantially uniform luminance, so that the light-emitting module 20 functions as a surface-emitting light source that emits light with uniform luminance.

Figure 3:
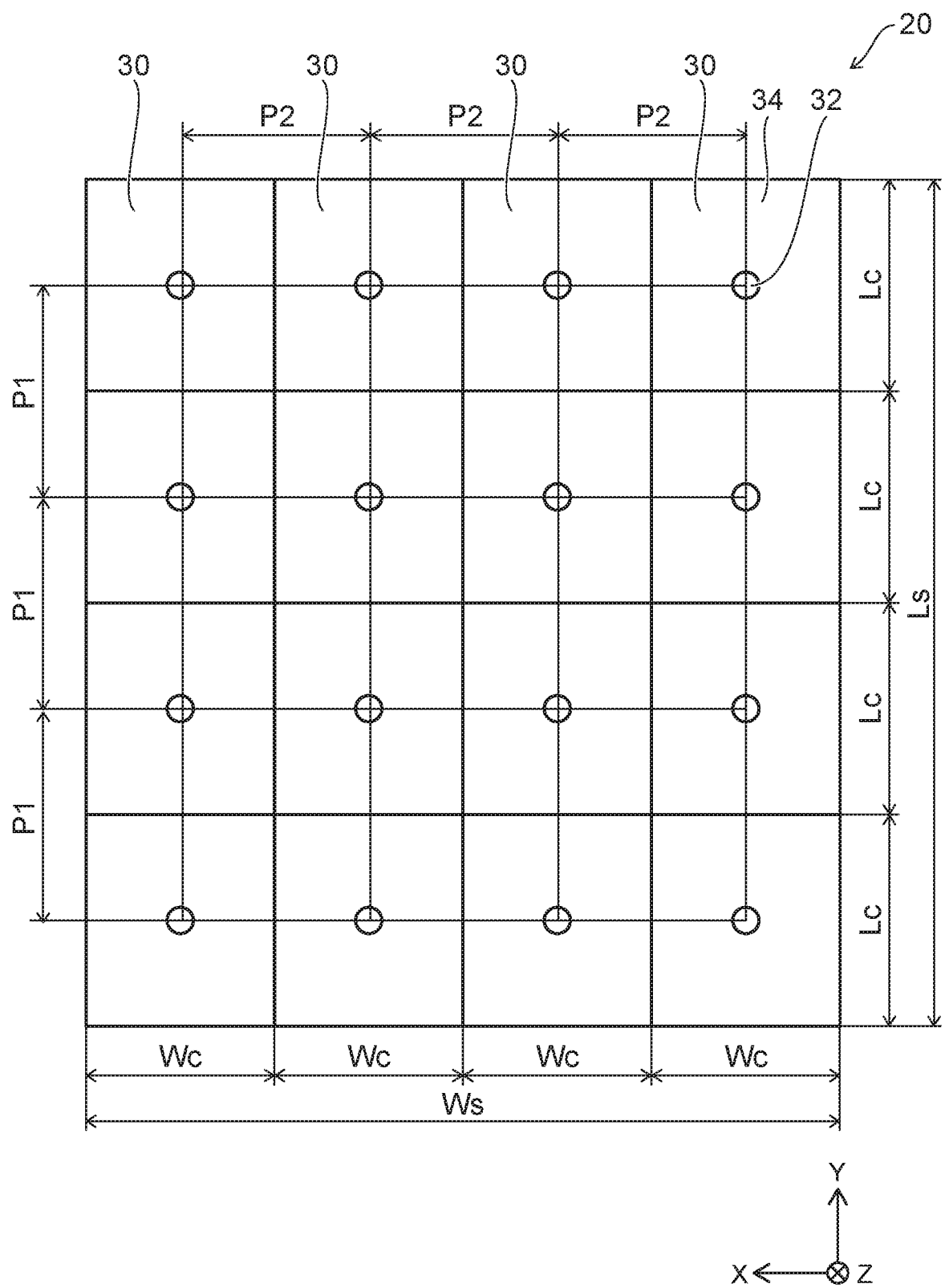
FIG. 3 is a schematic bottom view showing an example of a portion of the light-emitting module according to the first embodiment.

FIG. 3 is a schematic bottom view showing an example of a portion of the light-emitting module according to the embodiment.

As shown in FIG. 3, a plurality of light-emitting elements 32 of the light-emitting module 20 are disposed at substantially regular intervals in the X-axis direction and disposed at substantially regular intervals in the Y-axis direction. The intervals between the light-emitting elements 32 are indicated by P2 in the X-axis direction and P1 in the Y-axis direction.

A structure in which the light-guiding plate 34 is combined with the light-emitting elements 32 is referred to as a cell 30. The light-emitting elements 32 are disposed substantially at the center of each cell of a light-guiding plate 34. Each cell of the light-guiding plate 34 has a substantially rectangular shape with a width Wc in the X-axis direction and a length Lc in the Y-axis direction in a plan view of the XY plane. The light-guiding plate 34 guides light emitted from the light-emitting elements 32 (which are disposed substantially at the center of each cell) to the negative direction of the Z-axis. That is, the surface of the light-guiding plate 34 shown in FIG. 3 serves as the light-exiting surface.

In this example, the light-emitting module 20 includes a plurality of cells 30 two-dimensionally arranged in a four-by-four array. The light-emitting module 20 has a width Ws of 4×Wc in the X-axis direction and a length Ls of 4×Lc in the Y-axis direction.

In this example, the light-emitting elements 32 are light-emitting diodes, such as white light-emitting diodes. Colored light-emitting diodes are also applicable. The colored light-emitting diodes can be of the same color or different colors. White diodes can be mixed with colored light-emitting diodes. The light-emitting elements 32 do not have to be light-emitting diodes but can be laser diodes or the like.

The cells are two-dimensionally arranged in a four-by-four array in the light-emitting module 20 of this example, but the arrangement of the cells is not limited to this arrangement. The arrangement may be, for example, a two-by-eight array. The number of the cells included in the light-emitting module 20 is also not limited to 16, and a desired number is applicable.

The circuit is constituted of two series connections by eight parallel connections in the above description, but this constitution is not limited thereto. For example, a constitution of four series connections by four parallel connections can be employed. The arrangement of the light-emitting elements 32 included in the light-emitting module 20 is not limited to four by four but can be, for example, two by eight. The number of the light-emitting elements 32 included in the light-emitting module 20 is also not limited to 16, and a desired number can be selected.

The operation of the light-emitting module of the embodiment will be described.

In this example, two light-emitting elements are connected in series by the wiring layer 40, and four sets of the two light-emitting elements each connected in series are connected in parallel to constitute the two of the wiring-pattern groups 40a and 40b as described above. The two of the wiring-pattern groups 40a and 40b are connected in parallel. That is, the light-emitting module 20 in this example includes 16 light-emitting elements of 2 series connections by 8 parallel connections.

Figure 4:
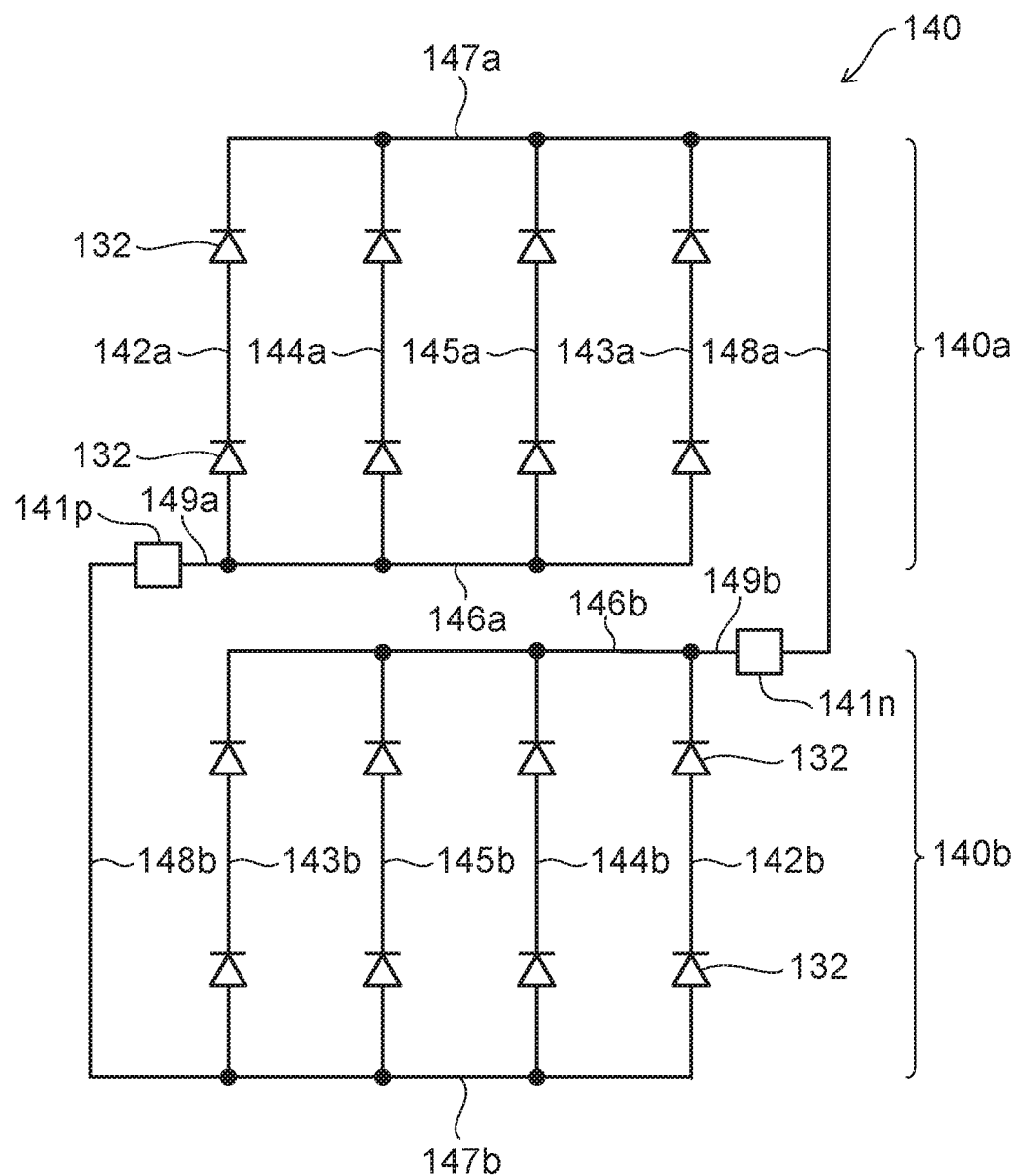
FIG. 4 is an equivalent circuit diagram simplified to illustrate the operation of the light-emitting module of the first embodiment.

FIG. 4 is an equivalent circuit diagram simplified to illustrate the operation of the light-emitting module 20 of the embodiment.

As shown in FIG. 4, an equivalent circuit 140 of the circuit constituted in the wiring layer 40 includes terminals 141p and 141n, a first equivalent circuit 140a, and a second equivalent circuit 140b, which are connected in parallel between the terminals 141p and 141n. The first equivalent circuit 140a corresponds to the wiring-pattern group 40a, and the second equivalent circuit 140b corresponds to the wiring-pattern group 40b. As described above, the equivalent circuits 140a and 140b are equivalent and have the same pattern. The description of the equivalent circuit 140b is omitted as appropriate.

The equivalent circuit 140a includes a plurality of light-emitting elements 132 and a plurality of wirings 142a to 149a (i.e., 142a, 143a, 144a, 145a, 146a, 147a, 148a and 149a). Two light-emitting elements 132 are connected in series on each of the wirings 142a to 145a. The series circuits each including two light-emitting elements 132 are connected in parallel by the wirings 146a and 147a.

The above parallel circuit is connected to the terminal 141p via the wiring 149a and to the terminal 141n via the wiring 148a.

The same applies to the equivalent circuit 140b, which includes a plurality of light-emitting elements 132 and a plurality of wirings 142b to 149b (i.e., 142b, 143b, 144b, 145b, 146b, 147b, 148b and 149b).

The circuit configuration of the light-emitting module 20 is not limited to two series connections by eight parallel connections. A desired configuration can be employed as long as the Y wiring patterns constitute equal-length wiring with respect to the terminals as described above. For example, a circuit configuration of four series connections by four parallel connections or a circuit configuration of eight series connections by two parallel connections can be employed. In the case in which the number of the cells 30 is different, appropriate numbers of series and parallel connections can be selected.

An equivalent circuit using the resistance of each of the wirings 142a to 149a (i.e., 142a, 143,a, 144a and 145a) can be derived on the assumption that the light-emitting elements 132 in the equivalent circuit 140 described above are constant-voltage circuits with a voltage of 0 V or a sufficiently low voltage.

Figure 5:
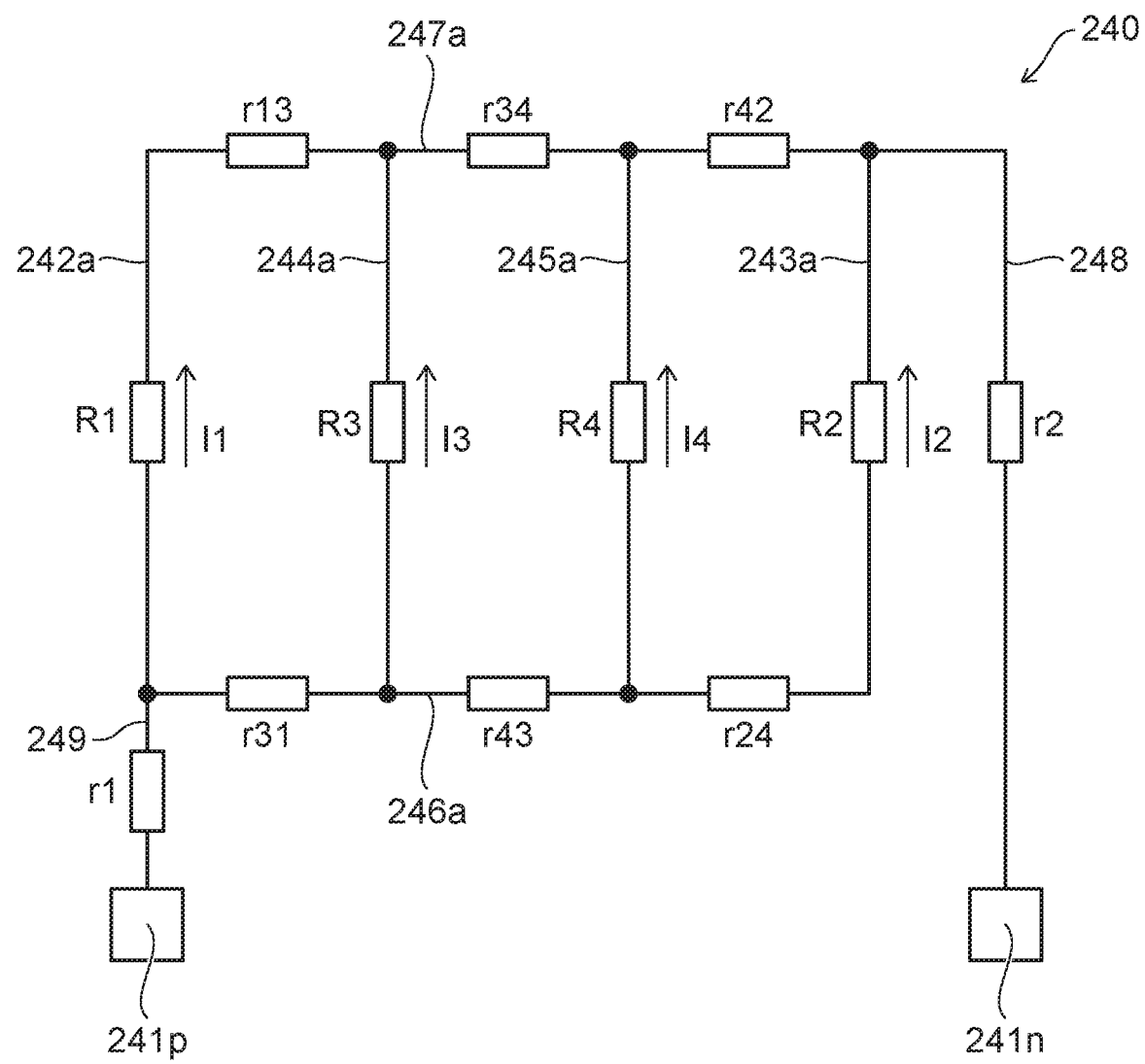
FIG. 5 is an equivalent circuit diagram simplified to illustrate the operation of the light-emitting module of the first embodiment.

FIG. 5 is an equivalent circuit diagram simplified to illustrate the operation of the light-emitting module of the embodiment.

FIG. 5 shows a resistor network based on the first equivalent circuit 140a. The second equivalent circuit 140b can be regarded as the same resistor network.

An equivalent circuit 240 for the wiring layer 40 includes portions 242a to 245a (i.e., 242a, 243a, 244a and 245a) respectively corresponding to the Y wiring patterns 42a to 45a, and portions 246a and 247a respectively corresponding to the X wiring patterns 46a and 47a as shown in FIG. 5. The equivalent circuit 240 also includes portions 248a and 249a respectively corresponding to the wiring patterns 48a and 49a. Each of the portions 242a to 249a (i.e., 242242a, 243a, 244a, 245a, 246a, 247a, 248a, 249a) has a resistance based on the material constituting the wiring pattern and its width, length, and thickness.

The portion 242a has a resistance R1. The portion 243a has a resistance R2. The portions 244a and 245a positioned between the portions 242a and 243a respectively have resistances R3 and R4.

As for the portion 247a, the resistance between the portions 242a and 244a is r13, the resistance between the portions 244a and 245a is r34, and the resistance between the portions 245a and 243a is r42.

As for the portion 246a, the resistance between the portions 242a and 244a is r31, the resistance between the portions 244a and 245a is r43, and the resistance between the portions 245a and 243a is r24.

The portions 248a and 249a respectively have resistances r2 and r1.

If equal-length wiring is constituted between the terminals 241p and 241n such that the path lengths through the portions 242a to 245a are substantially equal as described above, for example, the resistances r13, r34, r42, r31, r43, and r24 are equal, and the resistances R1, R2, R3, and R4 are equal.

A current source is connected between the terminals 241p and 241n under the above conditions, and the electric currents of the portions 242a to 245a are simulated while sweeping the current. The result shows that these electric currents are not equal.

More specifically, it is observed that electric currents I1 and I2 that flow through the outside portions 242a and 243a are higher than electric currents I3 and I4 that flow through the portions 244a and 245a positioned between the portions 242a and 243a.

To equalize all the electric currents that flow through the portions 242a to 245a, the resistances of the portions 242a to 245a are required to be adjusted. The portions 242a to 245a are connected in parallel by the portions 246a and 247a. Hence, the resistances R1 and R2 of the portions 242a and 243a positioned at outside are lower than the resistances R3 and R4 of the portions 244a and 245a positioned between the portions 242a and 243a.

Accordingly, adjusting the resistances R3 and R4 can make the electric currents I1 and I2 that flow through the portions 242a and 243a substantially equal to the electric currents I3 and I4 that flow through the portions 244a and 245a. In this case, the resistances R3 and R4 are lower than the resistances R1 and R2.

In the case in which the thickness of the wiring patterns is constant throughout the wiring layer 40, the wiring patterns 44a and 45a are formed in greater widths than the widths of the wiring patterns 42a and 43a.

In the case in which the wiring patterns in the wiring layer 40 are formed in variable thicknesses, the wiring patterns 44a and 45a can be formed in greater thicknesses than the thicknesses of the wiring patterns 42a and 43a.

The effects of the light-emitting module of the present embodiment will be described.

In the light-emitting module 20 of the present embodiment, the resistance of each of the Y wiring patterns connected in parallel and provided with the light-emitting elements 32 is appropriately adjusted, so that the electric currents that flow through the light-emitting elements mounted on the Y wiring patterns can be substantially equalized. Substantially equalizing the electric currents that flow through the light-emitting elements arranged in a plane can reduce luminance variances in the plane, to thereby providing a surface-emitting light source that emits light with uniform luminance.

The light-emitting module 20 of the present embodiment can have a structure in which the light-emitting elements 32 are densely arranged because the light-emitting elements 32 are disposed at regular intervals in the XY plane. Employing such a structure in the light-emitting module 20 of the present embodiment is particularly effective because the differences of the electric currents that flow through the light-emitting elements greatly affect the luminance variances in the plane.

The Y wiring patterns do not have to be arranged parallel to each other, and the wiring lengths of the Y wiring patterns do not have to be equal, as long as the resistances of the wiring patterns are set so as to substantially equalize the electric currents that flow through the Y wiring patterns separated from each other and connected in parallel by the X wiring patterns as described above.

The case in which two Y wiring patterns are connected between two Y wiring patterns has been described above, but five or more Y wiring patterns can be included as long as three or more Y wiring patterns are included. In the case in which five Y wiring patterns are included, for example, three Y wiring patterns positioned between outside Y wiring patterns respectively have resistances lower than the resistances of the outside Y wiring patterns. For example, the three Y wiring patterns positioned between the outside Y wiring patterns respectively have widths greater than the widths of the outside Y wiring patterns.

Second Embodiment

Figure 6A:
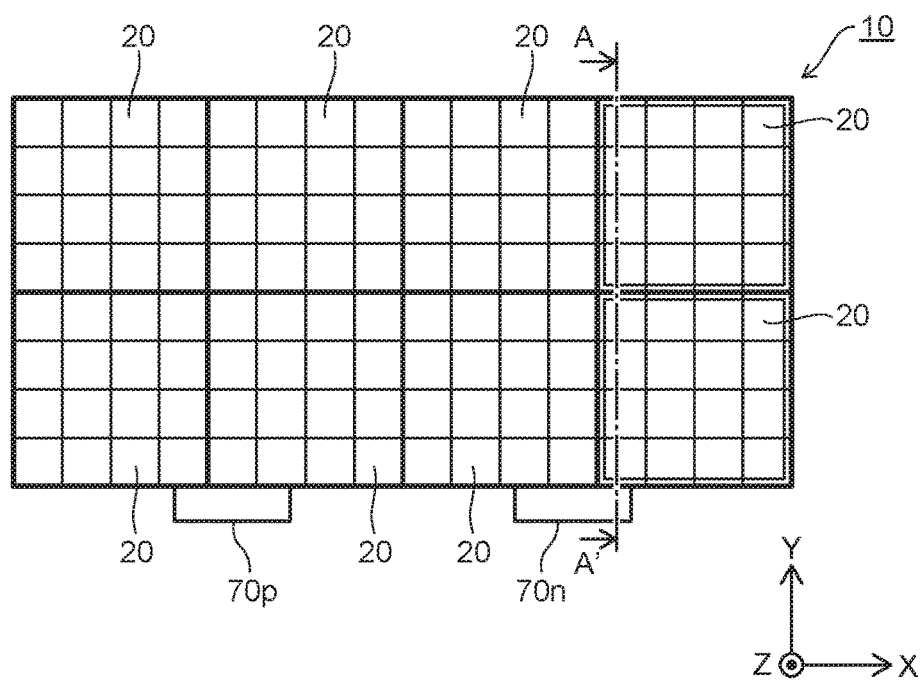
FIG. 6A is an illustrative schematic top view of a surface-emitting light source of a second embodiment.

FIG. 6A is an illustrative schematic plan view of a surface-emitting light source of the present embodiment.

Figure 6B:
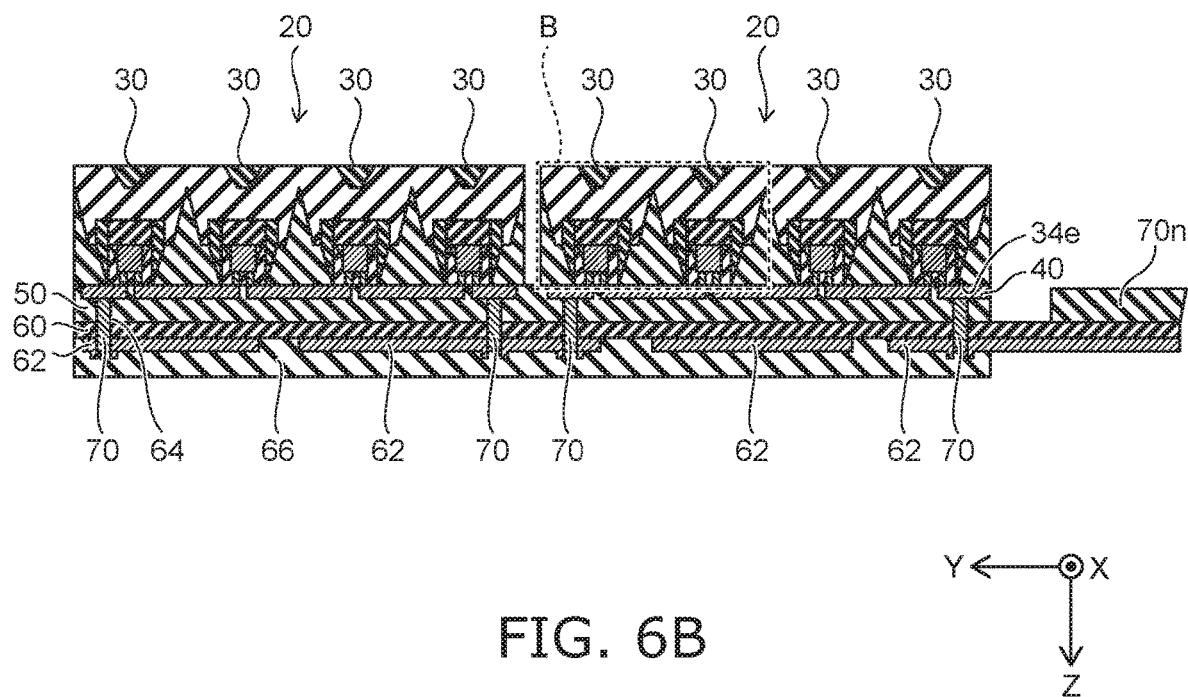
FIG. 6B is a schematic cross-sectional view taken along the line AA' and viewed in a direction of the arrows of FIG. 6A.

FIG. 6B is a schematic cross-sectional view taken along the line AA' and viewed in a direction of the arrows of FIG. 6A.

As shown in FIG. 6A, a surface-emitting light source 10 includes a plurality of light-emitting modules 20. The light-emitting modules 20 are arranged in the XY plane. In this example, four light-emitting modules 20 are arranged in the X-axis direction, and two light-emitting modules 20 are arranged in the Y-axis direction, to be arranged in two dimensions as a whole.

The surface-emitting light source 10 includes connectors 70p and 70n. A lower DC or pulse voltage than the voltage applied to the connector 70p is applied to the connector 70n.

The light-emitting modules 20 constituting the surface-emitting light source 10 are connected to a board 60 with an insulating connecting member 50 interposed therebetween as shown in FIG. 6B. The insulating connecting member 50 is, for example, a bonding sheet in which an adhesive has been applied over the both surfaces of a resin sheet. The board 60 is, for example, a flexible printed circuit board formed of an insulating base material such as a polyimide.

The board 60 includes a wiring pattern 62. In this example, the wiring pattern 62 is formed on the surface opposite to the surface on which the connecting member 50 is disposed. The board 60 further includes an insulating layer 66 covering the wiring pattern 62. The insulating layer 66 can secure insulation of the wiring pattern 62. The insulating layer 66 is, for example, a resist.

The board 60 is provided with the connector 70n (and the connector 70p not shown in this drawing) to enable the surface-emitting light source 10 to be electrically connected to an external circuit via the connectors 70p and 70n.

Vias 70 run through the connecting member 50 and the board 60. Via holes 64 for the vias 70 reach the wiring layer 40 of the light-emitting module 20, and the vias 70 electrically connect the light-emitting module 20 to the wiring pattern 62 of the board 60. The vias 70 are respectively connected to the terminals 41p and 41n in the wiring layer 40 of the light-emitting module 20.

For example, the wiring pattern 62 on the board 60 connects the light-emitting modules 20 in parallel. The connection is not limited thereto, and the wiring pattern 62 is appropriately formed to constitute a desired circuit. For example, different operating power sources can be connected to a plurality of light-emitting modules 20 electrically separated from each other to adjust the luminance and to set the chromaticity by screen division.

Figure 7:
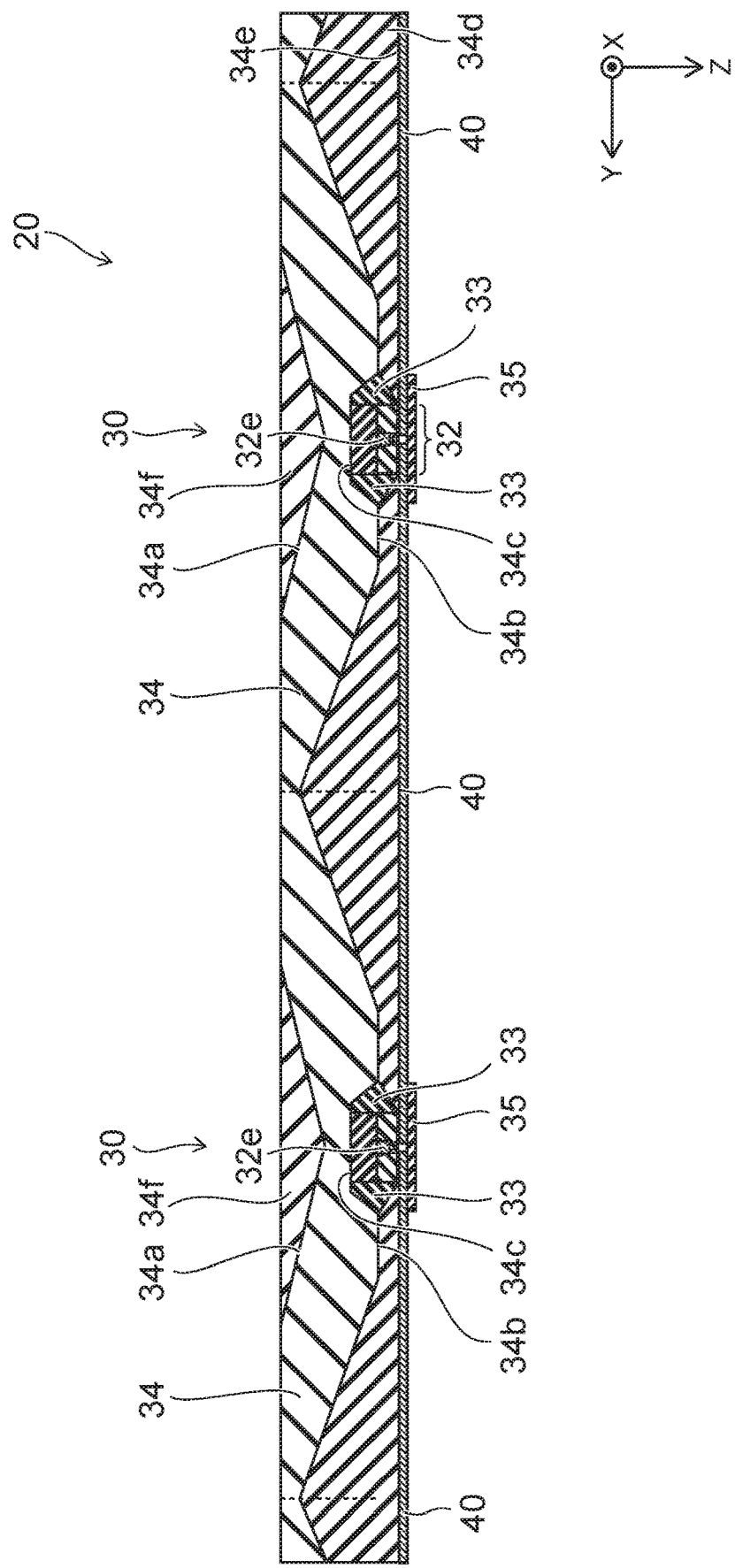
FIG. 7 is a schematic enlarged cross-sectional view of the portion B of FIG. 6B.

FIG. 7 is a schematic enlarged cross-sectional view of the portion B of FIG. 6B.

As shown in FIG. 6B, the light-emitting module 20 includes a plurality of cells 30. The cells 30 are each has a structure in which the light-emitting element 32 is supported by the light-guiding plate 34 as described referring to the first embodiment above.

The cell 30 includes the light-emitting element 32 and a portion of the light-guiding plate 34. The light-guiding plate 34 has a light-exiting surface 34a facing the negative direction of the Z-axis. The light-guiding plate 34 has a surface 34b opposite to the light-exiting surface 34a. The surface 34b of the light-guiding plate 34 has a recess 34c.

The light-emitting element 32 is inserted into the recess 34c and fixed to the light-guiding plate 34 by an insulating fixing member 33.

On the surface 34b, an insulating member 34d is provided with such a thickness that the electrodes of the light-emitting element 32 are exposed. In this example, the insulating member 34d has a wiring formation surface 34e opposite to the surface connected to the surface 34b of the light-guiding plate 34.

The wiring layer 40 is disposed on the wiring formation surface 34e. The wiring layer 40 is the same as in the first embodiment described above. The two electrodes of the light-emitting element 32 constitute a circuit with the wiring pattern of the wiring layer 40.

In the case in which the light-emitting element 32 is in small size, the distance between the electrodes is small, and the gap of the wiring pattern is short. Hence, in this example, an insulating resin 35 is applied at a position on the wiring layer 40 corresponding to the gap between the electrodes of the light-emitting element 32. The insulating resin 35 is, for example, an acrylic resin, epoxy-based resin, or a resist.

The light-exiting surface 34a of the light-guiding plate 34 preferably has at least one depressed portion 34f. The depressed portion 34f is a depression, preferably having, for example, the shape of a cone, a truncated cone, a polygonal pyramid, or a truncated polygonal pyramid.

FIG. 8 is an illustrative schematic cross-sectional view of the light-emitting element.

Figure 8A:
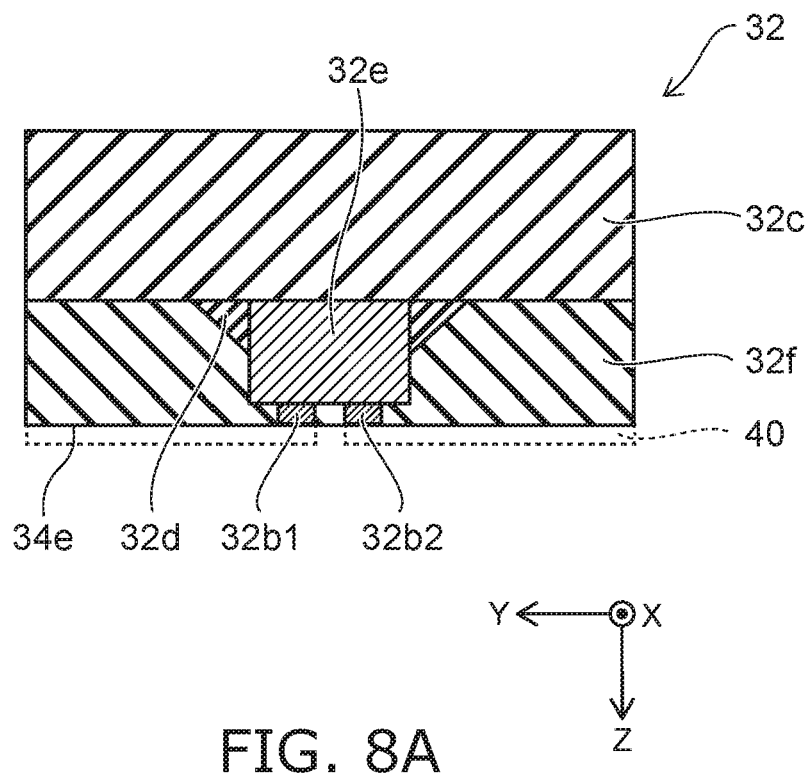
FIG. 8A is a schematic cross-sectional view of an example of the light-emitting element.

As shown in FIG. 8A, the light-emitting element 32 includes a semiconductor chip 32e, two electrodes 32b1 and 32b2, and a phosphor layer 32c. The surface provided with the phosphor layer 32c is the main light-exiting surface of the semiconductor chip 32e. The semiconductor chip 32e includes the electrodes 32b1 and 32b2 on the side of the surface opposite to the surface provided with the phosphor layer 32c. The electrodes 32b1 and 32b2 are an anode electrode and a cathode electrode.

The semiconductor chip 32e supports the phosphor layer 32c using an insulating supporting member 32d. The supporting member 32d is formed of, for example, a transparent resin. An insulating member 32f covers the semiconductor chip 32e and the supporting member 32d. The insulating member 32f is formed of, for example, a white resin.

As shown also in this drawing, the electrodes 32b1 and 32b2 of the light-emitting element 32 are exposed from the insulating member 34d. The surface of the insulating member 34d on which the electrodes 32b1 and 32b2 are exposed is the wiring formation surface 34e. The wiring layer 40 indicated by dashed lines is disposed on the wiring formation surface 34e.

Figure 8B:
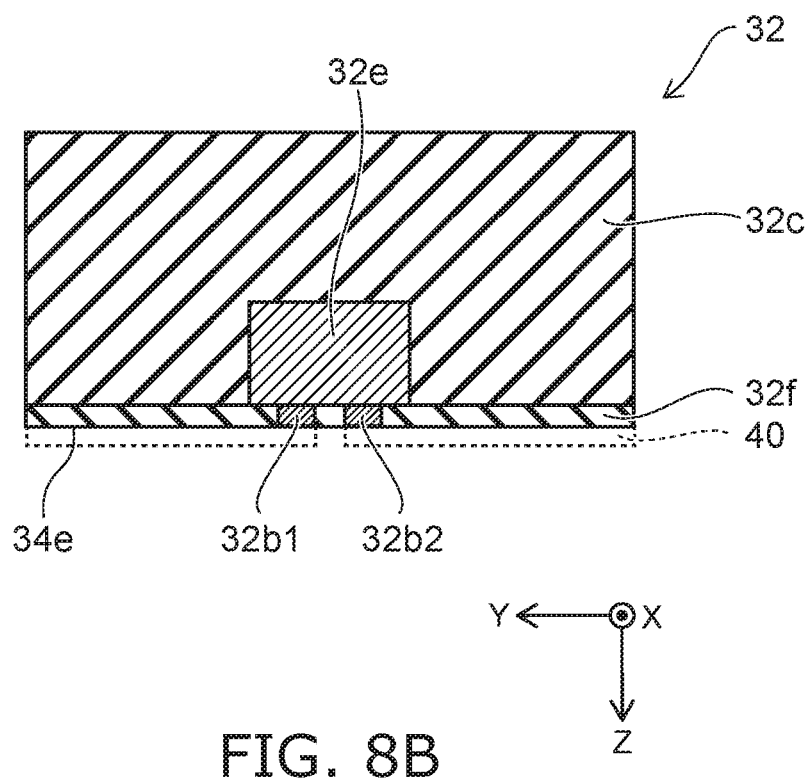
FIG. 8B is a schematic cross-sectional view of another example of the light-emitting element.

FIG. 8B is a schematic cross-sectional view of another example of the light-emitting element. The upper surface and the lateral surfaces of the semiconductor chip 32e are covered with the phosphor layer 32c. The lower surface of a semiconductor chip 32e and the lower surface of the phosphor layer 32c are covered with the insulating member 32f. The insulating member 32f is, for example, an insulating white resin member containing titanium oxide as a light-diffusing material.

A method of manufacturing the surface-emitting light source 10 of the present embodiment will be described.

FIG. 9A to FIG. 10B schematically illustrate the method of manufacturing the surface-emitting light source of the present embodiment.

In FIG. 9A to FIG. 9D, upper drawings are schematic perspective views of a structure for producing the light-emitting module 20, and lower drawings are schematic cross-sectional views of a portion corresponding to a cell in the structure.

Figure 10A:
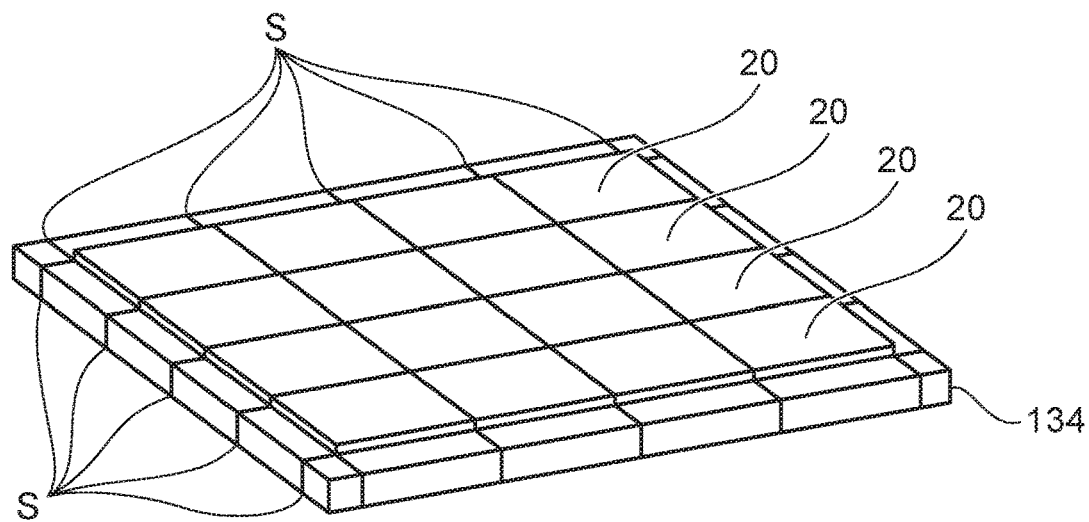
FIG. 10A is a schematic perspective view for illustrating the method of manufacturing the surface-emitting light source of the second embodiment.
Figure 10B:
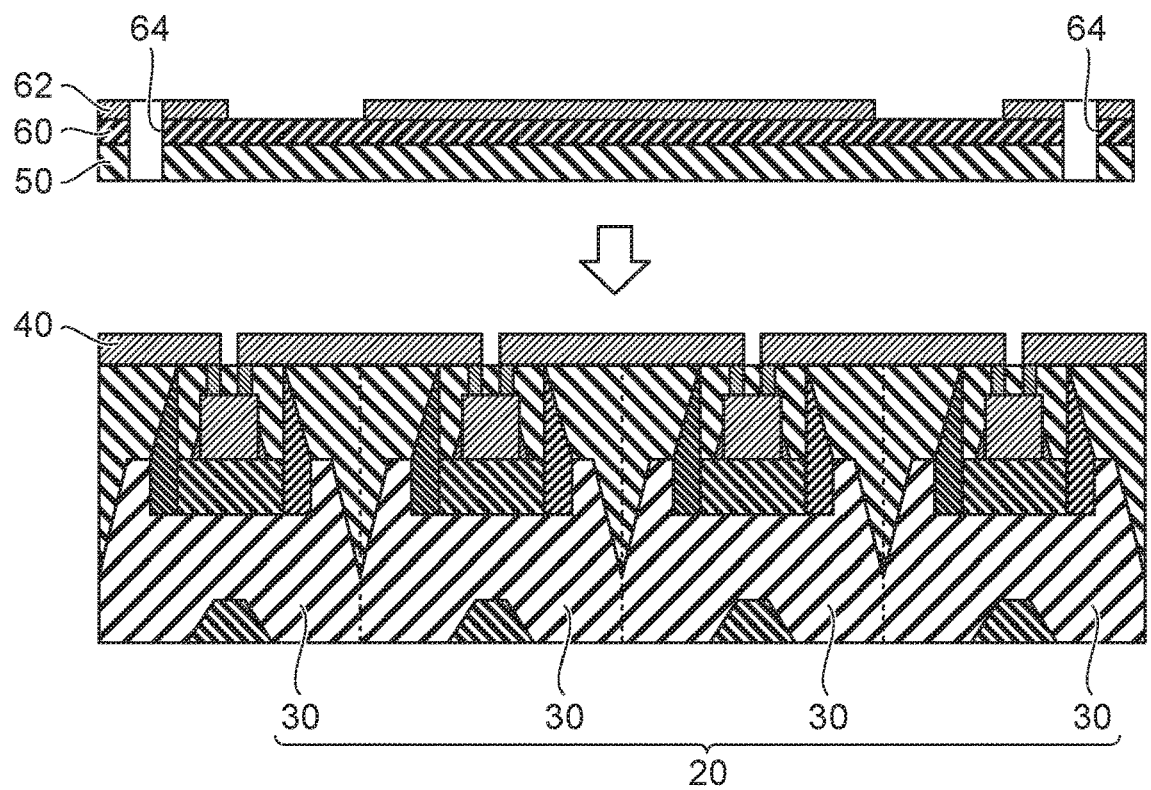
FIG. 10B is a schematic cross-sectional view for illustrating the method of manufacturing the surface-emitting light source of the second embodiment.

FIG. 10A is a schematic perspective view of the structure, and FIG. 10B is a schematic cross-sectional view that shows the assembly process of the finished light-emitting module 20.

Figure 9A:
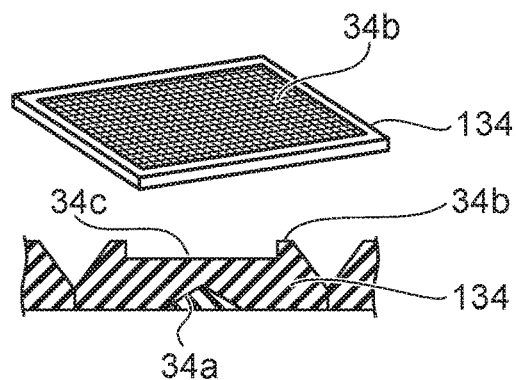
FIG. 9A includes a schematic perspective view and a cross-sectional view for illustrating a method of manufacturing the surface-emitting light source of the second embodiment.

A structure 134 is provided as shown in FIG. 9A. The structure 134 is formed by, for example, injection molding of a synthetic resin such as a polycarbonate. The structure 134 has the light-exiting surface 34a and the surface opposite to the light-exiting surface 34a. The single structure 134 shown in FIG. 9A includes a plurality of cells shown in FIG. 6B and other drawings, and the cells are each indicated by thin lines in the schematic perspective view. The same applies to FIG. 9B to FIG. 9D.

Figure 9B:
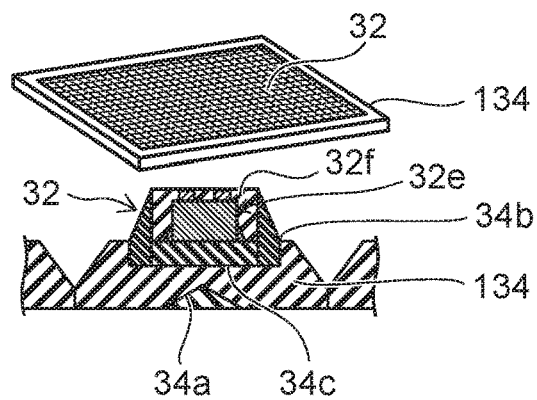
FIG. 9B includes a schematic perspective view and a schematic cross-sectional view for illustrating the method of manufacturing the surface-emitting light source of the second embodiment.

The light-emitting element 32 is mounted at the surface 34b side of the structure 134 as shown in FIG. 9B. The light-emitting element 32 is disposed into the recess 34c of the structure 134.

Figure 9C:
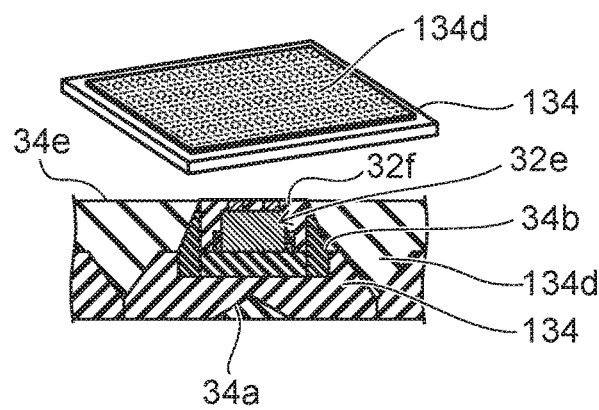
FIG. 9C includes schematic perspective view and a schematic cross-sectional view for illustrating the method of manufacturing the surface-emitting light source of the second embodiment.

An insulating member 134d is formed at the surface 34b side of the structure 134 as shown in FIG. 9C. When or after the insulating member 134d is formed, the thickness (the length in the Z-axis direction) thereof is adjusted such that the electrodes of the light-emitting element 32 are exposed. For example, the material of the insulating member 134d is formed to cover the electrodes of the light-emitting element 32, and the insulating member 134d can be removed from the surface opposite to the light-exiting surface 34a to expose the electrodes of the light-emitting element 32. The insulating member 134d constitutes the wiring formation surface 34e.

Figure 9D:
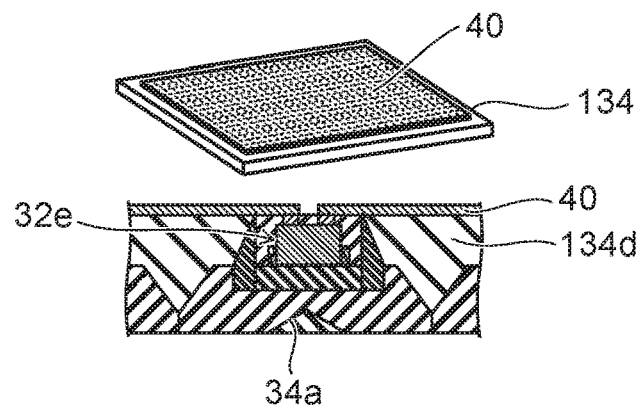
FIG. 9D includes a schematic perspective view and a schematic cross-sectional view for illustrating the method of manufacturing the surface-emitting light source of the second embodiment.

The wiring layer 40 is formed on the wiring formation surface 34e as shown in FIG. 9D. The wiring layer 40 is formed by, for example, printing. In the case in which the clearance between the electrodes of the light-emitting element 32 is narrow, the wiring layer can be formed such that the electrodes of the light-emitting element 32 are short-circuited, and then the wiring between the electrodes can be cut with, for example, a processing machine. Examples of the processing machine include a laser processing machine.

Scribe lines S are formed in the structure 134 as shown in FIG. 10A. After forming the scribe line, the structure 134 is divided along the scribe lines S. The light-emitting modules 20 can be obtained by the division along the scribe lines S.

The required number of the divided light-emitting modules 20 is aligned and connected to the board 60 as shown in FIG. 10B. The connecting member 50 is adhered on the surface of the board 60 intended to be connected to the light-emitting modules 20. The wiring pattern 62 is disposed on the surface opposite to the surface of the board 60 on which the connecting member 50 is adhered. The via holes 64 is formed at corresponding positions to electrically connect the wiring pattern 62 to the terminals of the light-emitting modules 20. The via holes 64 are filled with electrically conductive members. The electrically conductive members are, for example, electrically conductive metal paste.

The surface-emitting light source 10 is produced in this manner.

The effects of the surface-emitting light source 10 of the present embodiment will be described.

The surface-emitting light source 10 of the present embodiment includes a plurality of light-emitting modules 20. The light-emitting modules 20 are arranged in the same XY plane such that their light-exiting surfaces are flush with one another. In each light-emitting module 20, as described above, the light-emitting elements 32 are arranged in the XY plane, and the electric currents that flow through the Y wiring patterns are substantially equal. The light-emitting module 20 can therefore achieve surface emission with substantially uniform luminance. A plurality of such light-emitting modules 20 are arranged in the surface-emitting light source 10 and connected to one another by the wiring pattern 62 preliminarily disposed on the board, so that the luminance variances of the surface-emitting light source can be reduced.

A required size of the light source can be easily achieved because the surface-emitting light source 10 can be constituted by arranging a plurality of light-emitting modules 20.

Third Embodiment

As described above, the wiring patterns can have any shapes. In the present embodiment, luminance variances of the light-emitting elements are reduced by changing the shapes of the X wiring patterns and the Y wiring patterns in a top view of the XY plane to more strictly match the resistances.

Figure 11:
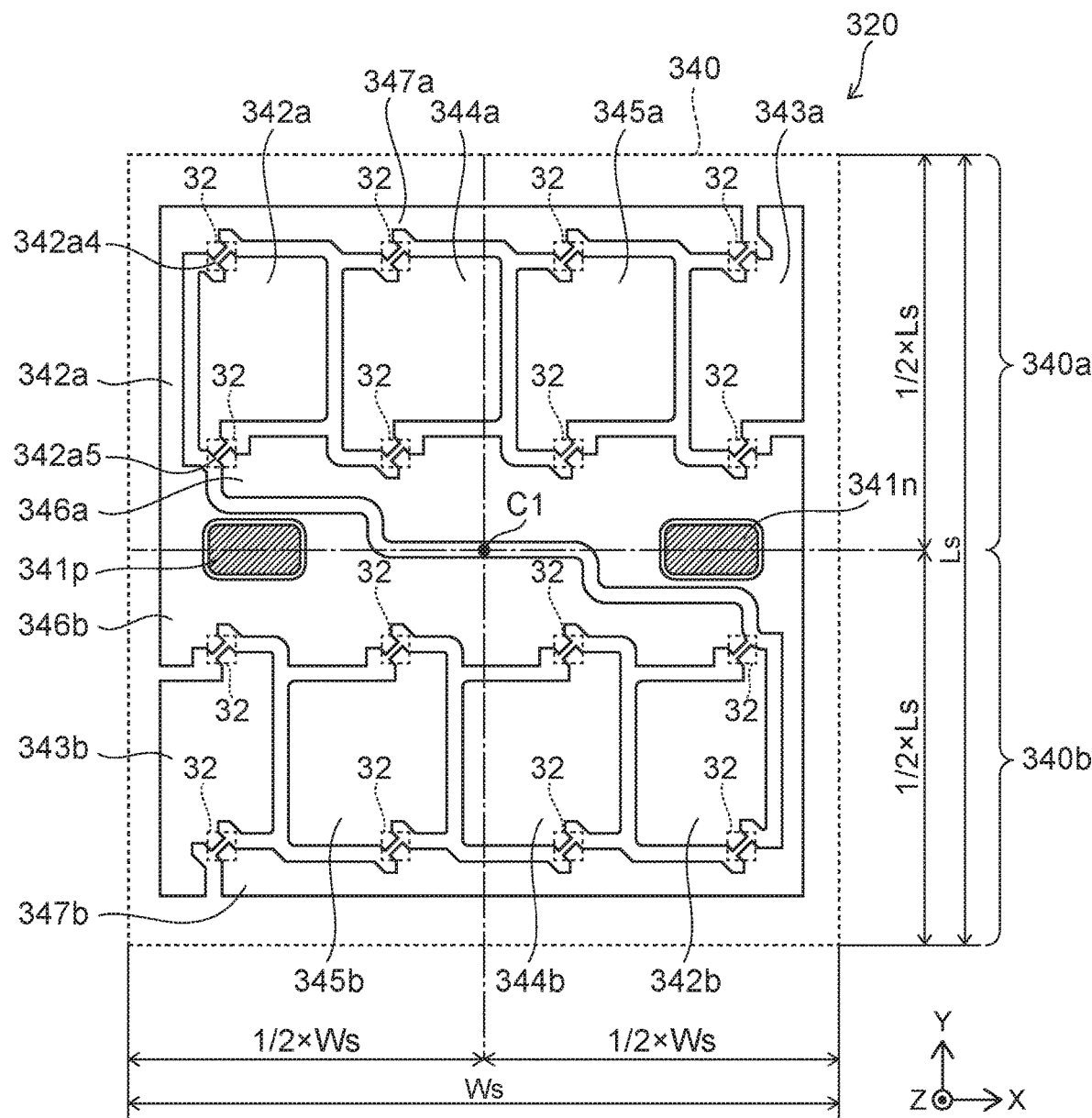
FIG. 11 is a schematic plan view showing an example of a portion of a light-emitting module according to a third embodiment.

FIG. 11 is a schematic top view showing an example of a portion of a light-emitting module according to the present embodiment.

FIG. 11 shows the layout of wiring patterns of a wiring layer 340 in a light-emitting module 320 of the present embodiment. Similarly to the case of the first embodiment described above, the wiring layer 340 is disposed on the wiring formation surface 34e (FIG. 6B and FIG. 7). The proportion of the area of the wiring layer 340 to the area of the wiring formation surface 34e is larger than in the case of the first embodiment. Hence, the light extraction efficiency can be improved by reflecting light traveling toward the surface 34b of the light-guiding plate 34 to guide the light to the light-exiting surface. The insulating resin 35 (FIG. 7) is applied over the entire wiring layer 340 in this example.

The wiring layer 340 includes terminals 341p and 341n and wiring-pattern groups 340a and 340b. The terminals 341p and 341n are portions of the X wiring patterns exposed from the insulating resin 35 (FIG. 7) so as to be connected to the vias 70 (FIG. 6B) in the case of employing the second embodiment described above. A positive voltage with reference to the voltage applied to the terminal 341n is applied to the terminal 341p. Similarly to the case of the first embodiment, the wiring-pattern groups 340a and 340b are connected in parallel between the terminals 341p and 341n. The wiring-pattern groups 340a and 340b are geometrically equivalent circuits and are symmetric about the point C1. The shapes of the terminals 341p and 341n and the wiring patterns constituting the wiring-pattern groups 340a and 340b in the present embodiment differ from the shapes of the corresponding terminals and the wiring patterns constituting the wiring-pattern groups in the first embodiment, and the dimensions of the wiring layer 340 and the light-emitting elements 32 to be mounted are the same as the dimensions of the corresponding wiring layer and the corresponding light-emitting elements to be mounted in the first embodiment. The same components in the first embodiment are indicated by the same reference numerals, and their detailed description is omitted as appropriate.

The wiring-pattern group 340a includes Y wiring patterns 342a to 345a (i.e., 342a, 343a, 344a and 345a) and X wiring patterns 346a and 347a. The wiring-pattern group 340b includes Y wiring patterns 342b to 345b (i.e., 342b, 343b, 344b and 345b) and X wiring patterns 346b and 347b. As the wiring-pattern group 340b has geometrically the same shape as the wiring-pattern group 340a, the group 340a of wiring patterns will be described.

The Y wiring patterns 342a to 345a are disposed substantially parallel to each other between the X wiring pattern 346a and the X wiring pattern 347a. The Y wiring patterns 344a and 345a are disposed between the Y wiring pattern 342a and the Y wiring pattern 343a. A gap 342a4 is formed between the Y wiring pattern 342a and the X wiring pattern 347a. A gap 342a5 is formed between the Y wiring pattern 342a and the X wiring pattern 346a. The light-emitting elements 32 are respectively disposed astride the gaps 342a4 and 342a5. A plurality of gaps are formed between the Y wiring patterns 343a to 345a and the X wiring patterns 346a and 347a, and the light-emitting elements 32 are disposed astride the gaps.

The Y wiring patterns 342a to 345a have substantially the same wiring lengths. The Y wiring patterns 344a and 345a have substantially the same widths. The widths of the Y wiring patterns 344a and 345a are respectively greater than the widths of the Y wiring patterns 342a and 343a. The light-emitting elements 32 are disposed on both ends of each of the Y wiring patterns 342a to 345a in the Y-axis direction, and the resistances of the Y wiring patterns 344a and 345a are lower than the resistances of the Y wiring patterns 342a and 343a. In this example, the width of the Y wiring pattern 342a is greater than the width of the Y wiring pattern 343a, to thereby reduce the luminance variances of the light-emitting elements 32 at both ends in the X-axis direction.

In this manner, the luminance variances of the light-emitting module 320 in the two-dimensional plane can be effectively reduced by appropriately selecting the shapes of the Y wiring patterns and the X wiring patterns.

According to the embodiments described above, a light-emitting module and a surface-emitting light source with reduced luminance variances can be provided.

A few embodiments of the present invention have been described above, but these embodiments are not intended to limit the scope of the invention but provide examples. These novel embodiments can be worked in other various forms, and omission, replacement, or change in a wide range can be carried out as long as the gist of the present invention is not changed. These embodiments and their modifications are included in the scope or gist of the invention and in the range of the claimed invention and its equivalents. In addition, the above embodiments can be combined with each other.

The invention claimed is:

1. A light-emitting module comprising:
a plurality of light-emitting elements arranged in a plan;

a light-guiding plate having a light-exiting surface and provided for the plurality of light-emitting elements; and a wiring layer disposed on a wiring formation surface opposite to the light-exiting surface of the light-guide plate, the wiring formation surface being constituted of electrodes of the plurality of light-emitting elements exposed at the wiring formation surface, and connected to the electrodes of the plurality of light-emitting elements, wherein the wiring layer comprises a first terminal, a second terminal capable of receiving a lower voltage than a voltage applied to the first terminal; and a plurality of wiring patterns including:
- a first wiring pattern connecting the first terminal and the second terminal;
- a second wiring pattern connecting the first terminal and the second terminal;
- a third wiring pattern disposed between the first wiring pattern and the second wiring pattern to connect the first terminal and the second terminal;
- a fourth wiring pattern connecting the first wiring pattern, the second wiring pattern, and the third wiring pattern in parallel, the fourth wiring pattern being connected to the first terminal; and
- a fifth wiring pattern connecting the first wiring pattern, the second wiring pattern, and the third wiring pattern in parallel, the fifth wiring pattern being connected to the second terminal, wherein a wiring length from the first terminal through the first wiring pattern to the second terminal, a wiring length from the first terminal through the second wiring pattern to the second terminal, and a wiring length from the first terminal through the third wiring pattern to the second terminal are the same, wherein a resistance of the third wiring pattern is lower than a resistance of the first wiring pattern and lower than a resistance of the second wiring pattern, and wherein the first and second terminals are positioned on the wiring formation surface on an opposite side of the fourth wiring pattern relative to the first, second, third, and fifth wiring patterns.

2. The light-emitting module according to claim 1, wherein the wiring pattern includes at least one additional third wiring pattern.

3. The light-emitting module according to claim 1,
wherein the plurality of light-emitting elements comprise at least one first light-emitting element, at least one second light-emitting element, and at least one third light-emitting element,
wherein the first wiring pattern connects the first light-emitting element to the first terminal and the second terminal,
wherein the second wiring pattern connects the second light-emitting element to the first terminal and the second terminal, and
wherein the third wiring pattern connects the third light-emitting element to the first terminal and the second terminal.

4. The light-emitting module according to claim 3, wherein the same number of the first light-emitting element, the second light-emitting element, and the third light-emitting element are each connected in series.

5. The light-emitting module according to claim 1, further comprising an insulating member covering at least a portion of a surface opposite to the light-exiting surface of the light-guiding plate and constituting the wiring formation surface.

6. A surface-emitting light source comprising a plurality of light-emitting modules according to claim 1,
wherein the plurality of light-emitting modules are arranged in two dimensions.

7. A light-emitting module comprising:
a plurality of light-emitting elements arranged in a plan;
a light-guiding plate having a light-exiting surface and provided for the plurality of light-emitting elements; and a wiring layer disposed on a wiring formation surface opposite to the light-exiting surface of the light-guide plate, the wiring formation surface being constituted of electrodes of the plurality of light-emitting elements exposed at the wiring formation surface, and connected to the electrodes of the plurality of light-emitting elements, wherein the wiring layer comprises a first terminal, a second terminal capable of receiving a lower voltage than a voltage applied to the first terminal; and a plurality of wiring patterns including:
- a first wiring pattern connecting the first terminal and the second terminal;
- a second wiring pattern connecting the first terminal and the second terminal;
- a third wiring pattern disposed between the first wiring pattern and the second wiring pattern to connect the first terminal and the second terminal;
- a fourth wiring pattern connecting the first wiring pattern, the second wiring pattern, and the third wiring pattern in parallel, the fourth wiring pattern being connected to the first terminal; and
- a fifth wiring pattern connecting the first wiring pattern, the second wiring pattern, and the third wiring pattern in parallel, the fifth wiring pattern being connected to the second terminal, wherein a wiring length from the first terminal through the first wiring pattern to the second terminal, a wiring length from the first terminal through the second wiring pattern to the second terminal, and a wiring length from the first terminal through the third wiring pattern to the second terminal are the same, wherein a resistance of the third wiring pattern is lower than a resistance of the first wiring pattern and lower than a resistance of the second wiring pattern, and wherein in a direction parallel to the wiring formation surface, a width of the third wiring pattern in a direction perpendicular to an elongation direction of the third wiring pattern is greater than a width of the first wiring pattern in a direction perpendicular to an elongation direction of the first wiring pattern and is greater than a width of the second wiring pattern in a direction perpendicular to a direction of elongation of the second wiring pattern.

8. A light-emitting module comprising:
a plurality of light-emitting elements arranged in a plan;
a light-guiding plate having a light-exiting surface and provided for the plurality of light-emitting elements; and
a wiring layer disposed on a wiring formation surface opposite to the light-exiting surface of the light-guide plate, the wiring formation surface being constituted of electrodes of the plurality of light-emitting elements exposed at the wiring formation surface, and connected to the electrodes of the plurality of light-emitting elements, wherein the wiring layer comprises a first terminal, a second terminal capable of receiving a lower voltage than a voltage applied to the first terminal; and a plurality of wiring patterns including:
- a first wiring pattern connecting the first terminal and the second terminal;
- a second wiring pattern connecting the first terminal and the second terminal;
- a third wiring pattern disposed between the first wiring pattern and the second wiring pattern to connect the first terminal and the second terminal;
- a fourth wiring pattern connecting the first wiring pattern, the second wiring pattern, and the third wiring pattern in parallel, the fourth wiring pattern being connected to the first terminal; and
- a fifth wiring pattern connecting the first wiring pattern, the second wiring pattern, and the third wiring pattern in parallel, the fifth wiring pattern being connected to the second terminal, wherein a wiring length from the first terminal through the first wiring pattern to the second terminal, a wiring length from the first terminal through the second wiring pattern to the second terminal, and a wiring length from the first terminal through the third wiring pattern to the second terminal are the same, wherein a resistance of the third wiring pattern is lower than a resistance of the first wiring pattern and lower than a resistance of the second wiring pattern, and wherein a thickness of the third wiring pattern in a direction perpendicular to the wiring formation surface is greater than thicknesses of the first wiring pattern and the second wiring pattern in a direction perpendicular to the wiring formation surface, said difference in thickness between the third wiring pattern and the first and second wiring patterns causing the resistance of the third wiring pattern to be lower than the resistance of the first and second wiring patterns.

\* \* \* \* \*